(12) United States Patent
Son et al.

(10) Patent No.: US 7,998,851 B2
(45) Date of Patent: Aug. 16, 2011

(54) SEMICONDUCTOR DEVICES HAVING CONTACT PLUGS WITH STRESS BUFFER SPACERS AND METHODS OF FABRICATING THE SAME

(75) Inventors: Yong-Hoon Son, Gyeonggi-do (KR);
Yu-Gyun Shin, Gyeonggi-do (KR);
Jong-Wook Lee, Gyeonggi-do (KR);
Sun-Ghil Lee, Gyeonggi-do (KR);
In-Soo Jung, Gyeonggi-do (KR);
Young-Eun Lee, Gyeonggi-do (KR);
Deok-Hyung Lee, Gyeonggi-do (KR)

(73) Assignee: Samsung Electronics Co., Ltd., Maetan-dong, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 12/715,599

(22) Filed: Mar. 2, 2010

(65) Prior Publication Data
US 2010/0159689 A1 Jun. 24, 2010

Related U.S. Application Data

(63) Continuation of application No. 11/092,524, filed on Mar. 29, 2005, now abandoned.

(30) Foreign Application Priority Data

Apr. 26, 2004 (KR) .............................. 2004-0028804

(51) Int. Cl.
*H01L 21/36* (2006.01)
(52) U.S. Cl. ........ 438/607; 438/629; 438/639; 438/672; 438/674; 438/675; 257/774; 257/E27.098; 257/E21.661; 257/E21.585; 257/E21.576; 257/E21.577; 257/E21.586; 257/E21.433; 257/E21.435; 257/E21.507
(58) Field of Classification Search .................. None
See application file for complete search history.

(56) References Cited

U.S. PATENT DOCUMENTS

| | | | |
|---|---|---|---|
| 5,352,916 A | 10/1994 | Kiyono et al. | |
| 5,554,870 A | 9/1996 | Fitch et al. | |
| 5,675,185 A | 10/1997 | Chen et al. | |
| 5,817,562 A * | 10/1998 | Chang et al. .................. | 438/305 |
| 6,022,766 A | 2/2000 | Chen et al. | |
| 6,146,927 A | 11/2000 | Yamanaka | |
| 6,207,494 B1 | 3/2001 | Graimann et al. | |
| 6,229,186 B1 | 5/2001 | Ishida | |
| 6,232,194 B1 | 5/2001 | Yaung et al. | |
| 6,368,405 B1 | 4/2002 | Shin | |

(Continued)

FOREIGN PATENT DOCUMENTS
JP 2003-017708 1/2003
(Continued)

*Primary Examiner* — Minh-Loan T Tran
*Assistant Examiner* — Fei Fei Yeung Lopez
(74) *Attorney, Agent, or Firm* — Muir Patent Consulting, PLLC

(57) ABSTRACT

A semiconductor device includes an inorganic insulating layer on a semiconductor substrate, a contact plug that extends through the inorganic insulating layer to contact the semiconductor substrate and a stress buffer spacer disposed between the node contact plug and the inorganic insulating layer. The device further includes a thin-film transistor (TFT) disposed on the inorganic insulating layer and having a source/drain region extending along the inorganic insulating layer to contact the contact plug. The device may further include an etch stop layer interposed between the inorganic insulating layer and the semiconductor substrate.

20 Claims, 6 Drawing Sheets

U.S. PATENT DOCUMENTS

| | | |
|---|---|---|
| 6,380,589 B1 | 4/2002 | Krivokapic |
| 6,417,539 B2 | 7/2002 | Gardner et al. |
| 6,521,949 B2 | 2/2003 | Assaderaghi et al. |
| 6,555,865 B2 | 4/2003 | Lee et al. |
| 6,620,659 B2 | 9/2003 | Emmma et al. |
| 6,656,783 B2 | 12/2003 | Park |
| 6,849,532 B2 | 2/2005 | Kim |
| 6,864,169 B2 | 3/2005 | Noguchi et al. |
| 6,867,094 B2 | 3/2005 | Park |
| 6,936,514 B1 * | 8/2005 | Pelella ......................... 438/250 |
| 2002/0094644 A1 * | 7/2002 | Chiang et al. ................. 438/279 |
| 2002/0111011 A1 | 8/2002 | Wu et al. |
| 2003/0068885 A1 | 4/2003 | Cheong |
| 2004/0126986 A1 * | 7/2004 | Wise et al. .................... 438/424 |

FOREIGN PATENT DOCUMENTS

| | | |
|---|---|---|
| KR | 10-1999-0041056 | 6/1999 |
| KR | 10-1999-00411056 | 6/1999 |
| KR | 10-2001-0066390 | 7/2001 |

* cited by examiner

SEMICONDUCTOR DEVICES HAVING CONTACT PLUGS WITH STRESS BUFFER SPACERS AND METHODS OF FABRICATING THE SAME

CROSS-REFERENCE TO RELATED APPLICATION

This application claims the benefit of Korean Patent Application No. 2004-0028804, filed Apr. 26, 2004, the contents of which are hereby incorporated by reference in their entirety. This application is a continuation of and claims priority to U.S. application Ser. No. 11/092,524, filed Mar. 29, 2005, now abandoned, the contents of which are hereby incorporated by reference in their entirety.

BACKGROUND OF THE INVENTION

The present invention relates to semiconductor devices and methods of fabricating the same and, more particularly, to semiconductor devices, such as memory devices, having contact plugs passing through insulating layers and methods of fabricating the same.

In semiconductor memory devices, a static random access memory (SRAM) device may offer advantages of lower power consumption and faster operating speed as compared to a dynamic random access memory (DRAM) device. Accordingly, the SRAM may be widely used for cache memory in computers and/or portable devices.

A unit cell of the SRAM device may be categorized as a load resistor SRAM cell or a complementary metal-oxide-semiconductor (CMOS) SRAM cell. The load resistor SRAM cell typically employs a high load resistor as a load device, while the CMOS SRAM cell typically employs a p-channel metal-oxide-semiconductor (PMOS) transistor as a load device.

CMOS SRAM cells may be categorized into two types. One type of CMOS SRAM cell is a thin film transistor (TFT) SRAM cell, which may employ TFTs stacked on a semiconductor substrate as the load device. Another is a bulk CMOS SRAM cell, which may employ bulk transistors formed at a semiconductor substrate as the load device.

A bulk CMOS SRAM cell may exhibit higher cell stability as compared to TFT SRAM cell and the load resistor SRAM cell. In other words, the bulk CMOS SRAM cell may have excellent low voltage characteristics and low stand-by current. This may be because the transistors that make up the bulk CMOS SRAM cell are typically formed of a single crystal silicon substrate. In contrast, the TFTs of the TFT SRAM cells are typically formed using a polysilicon layer as a body layer. However, a bulk CMOS SRAM cell may have lower integration density as well as weaker latch-up immunity as compared to a TFT SRAM cell. Therefore, in order to produce a highly integrated SRAM device having high reliability, the characteristics of the load transistors employed in the TFT SRAM cells may need to be improved.

Semiconductor devices having TFTs stacked on a semiconductor substrate are described in U.S. Pat. No. 6,022,766 to Chen et al. According to Chen et al., an improved field effect transistor (FET) structure comprises: a first insulator layer containing at least one primary level stud extending through the layer; an undoped cap oxide layer disposed over the insulator layer and abutting the upper region of each stud; a primary level thin film transistor (TFT) disposed over the undoped cap oxide layer; and a planarized oxide layer disposed over the TFT. Multiple TFTs can be stacked vertically, and connected to other levels of studs and metal interconnection layers. Chen et al. also discloses a protective interfacial cap over the surface of tungsten-type studs. The FET structure can serve as a component of a static random access memory (SRAM) cell.

A body layer of a TFT may be formed by depositing an amorphous silicon layer on the semiconductor substrate having the metal plug, and by crystallizing the amorphous silicon layer using a thermal treatment process. The body layer may be a polysilicon layer having large grains. As such, it may be difficult to convert the body layer into a perfect single crystal silicon layer. Consequently, it may be difficult to form TFTs having electrical characteristics comparable to that of a bulk transistor. Accordingly, there is a need for techniques for enhancing characteristics of a TFT stacked over a semiconductor substrate.

Techniques for forming contact plugs using a self-aligned contact technique are disclosed in Korean patent publication No. 2001-66390 to Chung et al., entitled "Methods of fabricating a contact plug of a semiconductor device using a selective epitaxial growth technique". FIGS. 1 and 2 are cross-sectional views illustrating operations for fabricating a contact plug described in the Korean patent publication No. 2001-66390.

Referring to FIG. 1, a field oxide layer, i.e., an isolation layer 12, is formed at a predetermined region of a semiconductor substrate 10, such as a silicon substrate, to define an active region. Gate patterns are formed, crossing over the active region and the isolation layer 12. Each of the gate patterns includes a gate electrode 14 and a hard mask pattern 16 that are sequentially stacked. The hard mask pattern 16 is formed from a silicon nitride layer. Spacers 18 are formed on sidewalls of the gate patterns. The spacers 18 are also formed of a silicon nitride layer. An inter-layer insulating layer 20 is formed on the substrate having the spacers 18, and the inter-layer insulating layer 20 is planarized using a chemical mechanical polishing (CMP) technique until the hard mask patterns 16 are exposed. The planarized inter-layer insulating layer 20 is patterned to form self-aligned contact holes that expose the active region between the gate patterns.

Referring to FIG. 2, an undoped silicate glass (USG) layer is formed on an entire surface of the substrate having the self-aligned contact holes. The USG layer may be formed using a plasma-enhanced chemical vapor deposition (PECVD) technique. When the self-aligned contact holes have an aspect ratio of 4 or more, the USG layer on the bottom surfaces of the self-aligned contact holes is formed to be thinner than the USG layer on the planarized inter-layer insulating layer 20 and the hard mask patterns 16. Accordingly, even though the USG layer is anisotropically etched until the active region between the gate patterns is exposed, the spacers 18 and the hard mask patterns 16 are still covered with the anisotropically etched USG layer 22' as shown in FIG. 2. Contact plugs 24, i.e., silicon plugs, are formed in the self-aligned contact holes surrounded by the anisotropically etched USG layer 22' using a selective epitaxial growth (SEG) technique.

The anisotropically etched USG layer 22' is formed in order to enhance a selectivity with respect to silicon during the SEG process. If the SEG process is performed on the substrate where the hard mask patterns 16, the spacers 18 and the planarized inter-layer insulating layer 20 are exposed, it may be difficult to find out an optimal process condition that does not cause crystalline defects, such as dislocations and/or stacking faults, in the silicon plugs 24. Accordingly, when the USG layer 22' is formed, it can be easier to obtain an optimal process condition of the SEG process suitable for formation of the silicon plugs 24 with reduced crystalline defects.

According to Chung et at as described above, because of the presence of the anisotropically etched USG layer, silicon plugs with reduced crystalline defects may be formed in self-aligned contact holes. However, when the USG layer is formed using a source material such as tetra-ethyl-ortho-silicate (TEOS), the USG layer may contain carbon atoms. In this case, it can be difficult to form a high performance TFT on the USG layer. This is because carbon atoms can penetrate into the body layer of the TFT to degrade a leakage current characteristic of the source and drain regions of the TFT. Alternatively, when a dense inorganic oxide layer, such as a high-density plasma (HDP) oxide layer, is formed instead of the USG layer, a strong physical stress may be applied to the silicon plugs, which can generate crystalline defects in the silicon plugs.

SUMMARY OF THE INVENTION

According to some embodiments of the present invention, a semiconductor device includes an inorganic insulating layer on a semiconductor substrate, a contact plug that extends through the inorganic insulating layer to contact the semiconductor substrate, and a stress buffer spacer disposed between the node contact plug and the inorganic insulating layer. The device further includes a thin-film transistor (TFT) disposed on the inorganic insulating layer and having a source/drain region extending along the inorganic insulating layer to contact the contact plug. The device may further include an etch stop layer interposed between the inorganic insulating layer and the semiconductor substrate.

The etch stop layer may include a silicon nitride layer. The inorganic insulating layer may include a high-density plasma (HDP) oxide layer. The contact plug may include a single crystal semiconductor plug. The stress buffer spacer may include a material that is less dense than the inorganic insulating layer, for example, a plasma tetra-ethyl-orthosilicate (TEOS) oxide layer. The TFT may include spaced-apart source/drain regions in a single crystal silicon pattern disposed on the inorganic insulating layer. The semiconductor device may further include an inter-layer insulating layer covering the TFT and a metal plug extending through the inter-layer insulating layer to contact the source/drain region of the TFT and the contact plug.

In further embodiments of the present invention, a thin film transistor (TFT) static random access memory (SRAM) cell includes a driver transistor and a transfer transistor disposed on a semiconductor substrate and connected in series. The cell also includes an inorganic insulating layer on the semiconductor substrate, covering the driver transistor and the transfer transistor. A contact plug extends through the inorganic insulating layer to contact a source/drain region shared by the driver transistor and the transfer transistor, and a stress buffer spacer is interposed between the contact plug and the inorganic insulating layer. The cell further includes a TFT load transistor disposed on the inorganic insulating layer and having a source/drain region extending along the inorganic insulating layer to contact the contact plug.

In some method embodiments of the present invention, an inorganic insulating layer is formed on a semiconductor substrate, and is patterned to form a contact hole exposing a region of the semiconductor substrate. A stress buffer spacer is formed on a sidewall of the contact hole. A contact plug is formed in the contact hole. The contact plug is surrounded by the stress buffer spacer and contacts the exposed region of the semiconductor substrate. A TFT is formed on the inorganic insulating layer, the TFT including a source/drain region extending along the inorganic insulating layer to contact the contact plug. An etch stop layer may be formed on the semiconductor substrate prior to the formation of the inorganic insulating layer, and the contact hole may be formed by patterning the inorganic insulating layer and the etch stop layer, the etch stop layer having an etch selectivity with respect to the inorganic insulating layer.

Forming the stress buffer spacer may include forming a material layer on the semiconductor substrate and conforming to sidewalls of the contact hole, the material layer including a material less dense than the inorganic insulating layer. The material layer is anisotropically etched to expose a bottom surface of the contact hole and the inorganic insulating layer and to leave a portion of the material layer on the sidewall of the node contact hole. The material layer may include a plasma tetra-ethyl-orthosilicate (TEOS) oxide layer. Forming a contact plug may include forming the contact plug using a selective epitaxial growth technique.

In some embodiments, forming a TFT includes forming an amorphous semiconductor layer or a polycrystalline semiconductor layer on the inorganic insulating layer and the contact plug, patterning the semiconductor layer to form a semiconductor body pattern on the inorganic insulating layer, the semiconductor body pattern extending along the inorganic insulating layer to contact the contact plug. The semiconductor body pattern is crystallized using a solid phase epitaxial process that employs the contact plug as a seed layer. In further embodiments, forming a TFT includes forming an amorphous semiconductor layer or a polycrystalline semiconductor layer on the inorganic insulating layer and the contact plug, crystallizing the semiconductor layer using a solid phase epitaxial process that employs the node contact plug as a seed layer, and patterning the crystallized semiconductor layer to form a crystallized semiconductor body pattern.

An inter-layer insulating layer may be formed on the TFT and patterned to form a contact hole exposing the source/drain region of the TFT and the contact plug. A metal plug may be formed that fills the contact hole and contacts the source/drain region of the TFT and the contact plug.

DETAILED DESCRIPTION OF EXEMPLARY EMBODIMENTS

Figure 1:
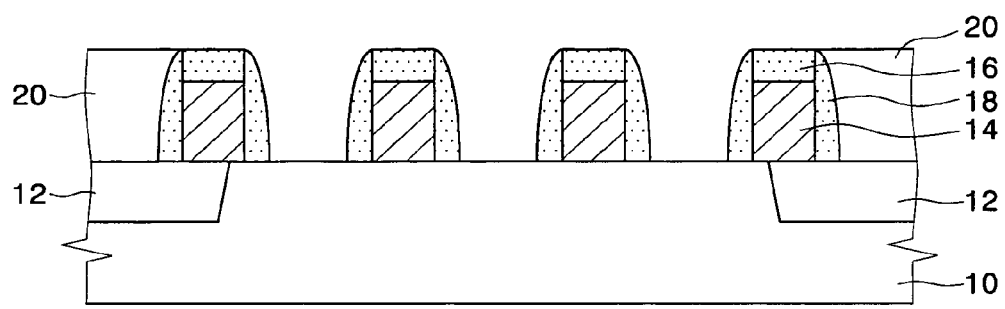
FIGS. 1 and 2 are cross-sectional views illustrating conventional techniques for forming a contact plug.
Figure 2:
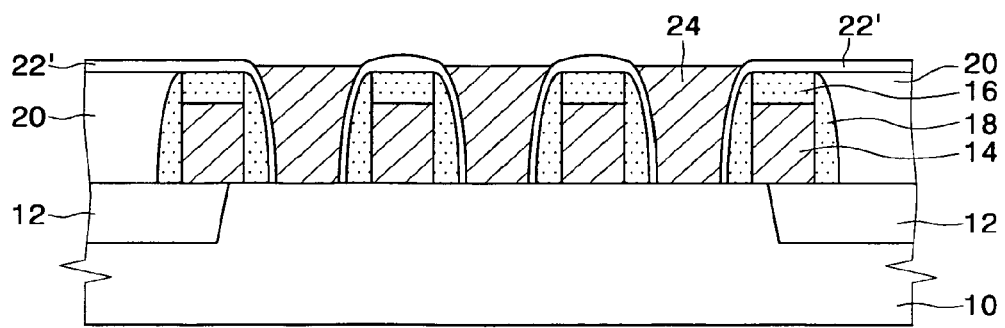

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments and is not intended to be limiting of the invention. As used herein, the singular forms "a", "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the Figures. For example, if the device in the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

Figure 3:
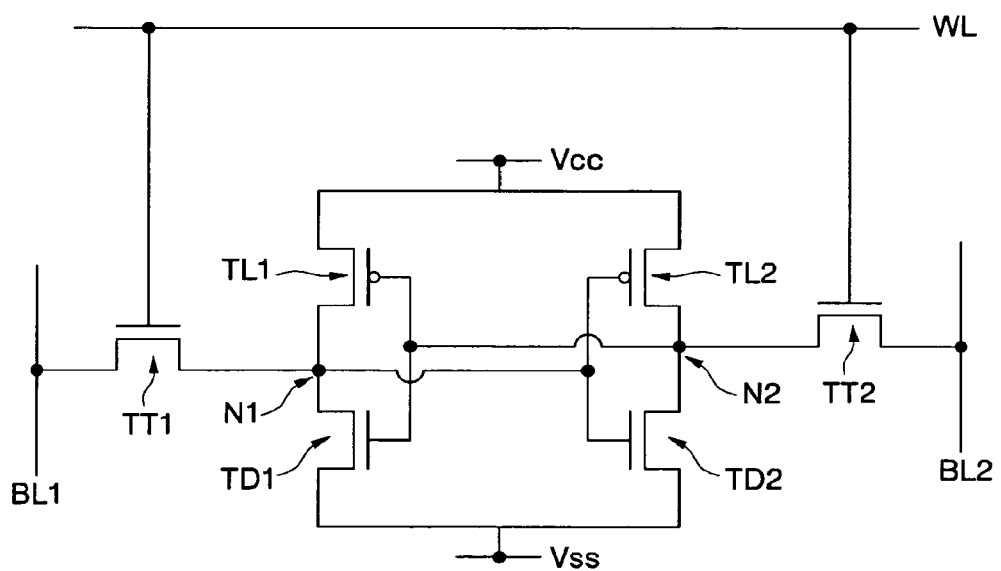
FIG. 3 is a schematic diagram illustrating an equivalent circuit for a CMOS SRAM cell.

FIG. 3 illustrates an equivalent circuit for a CMOS SRAM cell. Referring to FIG. 3, the CMOS SRAM cell includes a pair of driver transistors TD1 and TD2, a pair of transfer transistors TT1 and TT2, and a pair of load transistors TL1 and TL2. The driver transistors TD1 and TD2 and the transfer transistors TT1 and TT2 are NMOS transistors, whereas the load transistors TL1 and TL2 are PMOS transistors.

The first driver transistor TD1 and the first transfer transistor TT1 are serially connected. A source region of the first driver transistor TD1 is electrically connected to a ground line Vss, and a drain region of the first transfer transistor TT1 is electrically connected to a first bit line BL1. Similarly, the second driver transistor TD2 and the second transfer transistor TT2 are serially connected. A source region of the second driver transistor TD2 is electrically connected to the ground line Vss, and a drain region of the second transfer transistor TT2 is electrically connected to a second bit line BL2.

Source and drain regions of the first load transistor TL1 are electrically connected to a power supply line Vcc and a drain region of the first driver transistor TD1, respectively. Similarly, source and drain regions of the second load transistor TL2 are electrically connected to the power supply line Vcc and a drain region of the second driver transistor TD2, respectively. The drain region of the first load transistor TL1, the drain region of the first driver transistor TD1, and a source region of the first transfer transistor TT1 correspond to a first node N1. In addition, the drain region of the second load transistor TL2, the drain region of the second driver transistor TD2, and the source region of the second transfer transistor TT2 correspond to a second node N2. A gate electrode of the first driver transistor TD1 and a gate electrode of the first load transistor TL1 are electrically connected to the second node N2, and a gate electrode of the second driver transistor TD2 and a gate electrode of the second load transistor TL2 are electrically connected to the first node N1. Gate electrodes of the first and second transfer transistors TT1 and TT2 are electrically connected to a word line WL. The first driver transistor TD1, the first transfer transistor TT1 and the first load transistor TL1 are parts of a first half-cell, and the second driver transistor TD2, the second transfer transistor TT2 and the second load transistor TL2 are parts of a second half-cell.

The above-described CMOS SRAM cell may exhibit higher noise margin and lower stand-by current as compared to a load resistor SRAM cell. Accordingly, such a CMOS SRAM cell is widely employed in high performance SRAM devices that use a low power voltage. In particular, when the TFT SRAM cell includes high performance P-channel TFTs having enhanced electrical characteristics that correspond to those of P-channel bulk transistors used as load transistors of the bulk CMOS SRAM cell, the TFT SRAM cell may have advantages as compared to a bulk CMOS SRAM cell in terms of integration density and latch-up immunity. In order to realize a high performance P-channel TFT, it is desirable that the TFT be formed from a single crystal semiconductor body pattern.

Figure 4:
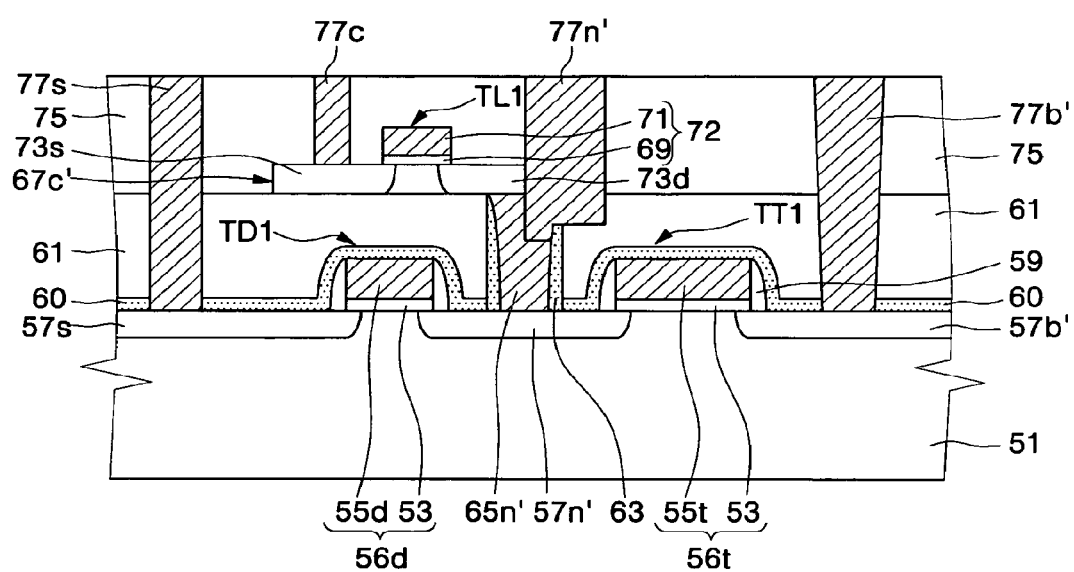
FIG. 4 is a cross-sectional view illustrating a half-cell of an SRAM cell in accordance with some embodiments of the present invention.

FIG. 4 is a cross-sectional view illustrating a first half-cell of a pair of half-cells of a TFT SRAM cell in accordance with some embodiments of the present invention. The pair of half-cells may have substantially the same structure. Accordingly, description of the second half-cell will be omitted in the present embodiment. The first half-cell illustrated in FIG. 4 includes a first driver transistor TD1, a first load transistor TL1 and a first transfer transistor TT1, having functions along the lines described above with reference to FIG. 3.

Referring to FIG. 4, an isolation layer (not shown) is formed at a predetermined region of a semiconductor substrate 51, for example, a single crystal silicon substrate, to define an active region. A ground impurity region 57s, a node impurity region 57n' and a bit line impurity region 57b', which are spaced from each other, are provided at a surface of the active region. A driver gate pattern 56d is disposed on the active region between the ground impurity region 57s and the node impurity region 57n', and a transfer gate pattern 56t is disposed on the active region between the node impurity region 57n' and the bit line impurity region 57b'. The driver gate pattern 56d includes a gate insulating layer 53 and a driver gate electrode 55d on the gate insulating layer 53, and the transfer gate pattern 56t includes the gate insulating layer 53 and a transfer gate electrode 55t on the gate insulating layer 53.

The transfer gate electrode 55t may extend across the active region to serve as a word line (corresponding to the word line WL of FIG. 3). Alternatively, the transfer gate electrode 55t may be a conductive layer connected to the word line WL. The driver gate pattern 56d, the ground impurity region 57s and the node impurity region 57n' correspond to the first driver transistor TD1 shown in FIG. 3, and the transfer gate pattern 56t, the node impurity region 57n' and the bit line impurity region 57b' correspond to the first transfer transistor TT1 shown in FIG. 3. As a result, the ground impurity region 57s corresponds to a source region of the first driver transistor TD1, and the bit line impurity region 57b' corresponds to a drain region of the first transfer transistor TT1. In addition, the node impurity region 57n' corresponds to a source region of the first transfer transistor TT1 and a drain region of the first driver transistor TD1.

Spacers 59 may be provided on sidewalls of the driver gate pattern 56d and the transfer gate pattern 56t. An inorganic insulating layer 61 is disposed on the semiconductor substrate having the first driver transistor TD1, the first transfer transistor TT1 and the spacers 59. It is preferable that the inorganic insulating layer 61 fills gaps between the gate patterns 56d and 56t without significant voids. For example, the inorganic insulating layer 61 may be an HDP oxide layer having dense film quality.

An etch stop layer 60 may be provided below the inorganic insulating layer 61 to cover the substrate having the first driver transistor TD1 and the first transfer transistor TT1. The etch stop layer 60 may be an insulating layer having an etch selectivity with respect to the inorganic insulating layer 61. For example, the etch stop layer 60 may be a silicon nitride layer.

The node impurity region 57n' is electrically connected to a node contact plug 65n' that penetrates the inorganic insulating layer 61 and the etch stop layer 60. The node contact plug 65n' may be a single crystal semiconductor plug, for example, a single crystal silicon plug. The single crystal semiconductor plug may be formed using an SEG technique.

A physical stress may be applied to the node contact plug 65n' during formation of the node contact plug 65n' or a subsequent annealing process, because the inorganic insulating layer 61 has a dense film quality. That is, when the inorganic insulating layer 61 has a dense film quality, the inorganic insulating layer 61 may not alleviate the stress applied to the single crystal semiconductor plug. In addition, the etch stop layer 60 may be a different material layer from the inorganic insulating layer 61. In this case, the selectivity of the SEG process may be lowered. As a result, crystalline defects may be generated in the node contact plug 65n' due to the poor selectivity of the SEG process and the stress from the inorganic insulating layer 61 while the node contact plug 65n' is grown.

In the illustrated embodiments, in order to suppress generation of crystalline defects in the node contact plug 65n', a stress buffer spacer 63 is interposed between the node contact plug 65n' and the inorganic insulating layer 61. When the etch stop layer 60 is additionally provided, the stress buffer spacer 63 may extend so that the stress buffer spacer 63 is also interposed between the node contact plug 65n' and the etch stop layer 60. The stress buffer spacer 63 may be a material layer less dense than the inorganic insulating layer 61. For example, the stress buffer spacer 63 may be an oxide layer formed by means of a plasma chemical vapor deposition (PCVD) technique that employs tetra-ethyl-orthosilicate (TEOS) as a source material. The stress buffer spacer 63 can significantly reduce physical stress applied by the inorganic insulating layer 61 on the node contact plug 65n'. In addition, even though the node contact hole is formed by patterning at least two different material layers (i.e., the inorganic insulating layer and the etch stop layer), the stress buffer spacer 63 on sidewalls of the node contact hole may prevent the selectivity of the SEG process for forming the node contact plug 65n' from being lowered. As a result, the stress buffer spacer 63 may significantly suppress generation of crystalline defects in the node contact plug 65n'.

A crystallized semiconductor body pattern 67c' is provided on the inorganic insulating layer 61, and the crystallized semiconductor body pattern 67c' extends to contact the node contact plug 65n'. The crystallized semiconductor body pattern 67c' may be a single crystal silicon pattern. A source region 73s and a drain region 73d, which are spaced apart from each other, are provided at respective ends of the crystallized semiconductor body pattern 67c'. The drain region 73d may extend to contact the node contact plug 65n'. A load gate electrode 71 is disposed across a channel region between the source region 73s and the drain region 73d. The load gate electrode 71 is insulated from the channel region by a gate insulating layer 69. The gate insulating layer 69 and the load gate electrode 71 are parts of a load gate pattern 72. The load gate pattern 72, the source region 73s and the drain region 73d correspond to the first load transistor TL1 shown in FIG. 3.

The semiconductor substrate having the first load transistor TL1 is covered with a lower inter-layer insulating layer 75. The drain region 73d and the node contact plug 65n' are electrically connected to a metal plug 77n' that penetrates the lower inter-layer insulating layer 75. The metal plug 77n' may be a metal layer in ohmic contact with both of an N-type impurity region and a P-type impurity region. For example, when the drain region 73d is doped with P-type impurities and the node contact plug 65n' and the node impurity region 67n' are doped with N-type impurities, the metal plug 77n' may be a tungsten plug. In other words, when the first load transistor TL1 and the first driver transistor TD1 are a PMOS transistor and an NMOS transistor, respectively, the first load transistor TL1 has an ohmic contact with the first driver transistor TD1 through the metal plug 77n'.

The ground impurity region 57s is electrically connected to a ground line contact plug 77s that penetrates through the lower inter-layer insulating layer 75, the inorganic insulating layer 61 and the etch stop layer 60. The source region 73s of the first load transistor TL1 is electrically connected to a power line contact plug 77c that penetrates through the lower inter-layer insulating layer 75. The bit line impurity region 57b' is electrically connected to a bit line contact plug 77b' that penetrates through the lower inter-layer insulating layer 75, the inorganic insulating layer 61 and the etch stop layer 60. The ground line contact plug 77s is electrically connected to a ground line (corresponding to Vss of FIG. 3), and the power line contact plug 77c is electrically connected to a power line (corresponding to Vcc of FIG. 3). In addition, the bit line contact plug 77b' is electrically connected to a bit line (e.g., corresponding to the bit line BL1 of FIG. 3).

Hereinafter, operations for fabricating TFT SRAM cells according to further embodiments of the present invention will be described with reference to FIGS. 5-10. FIGS. 5-10 are cross-sectional views illustrating operations for forming a first half-cell of a pair of half-cells of an SRAM cell. A second half-cell of the pair of half-cells is concurrently formed in substantially the same manner as the first half-cell.

Figure 5:
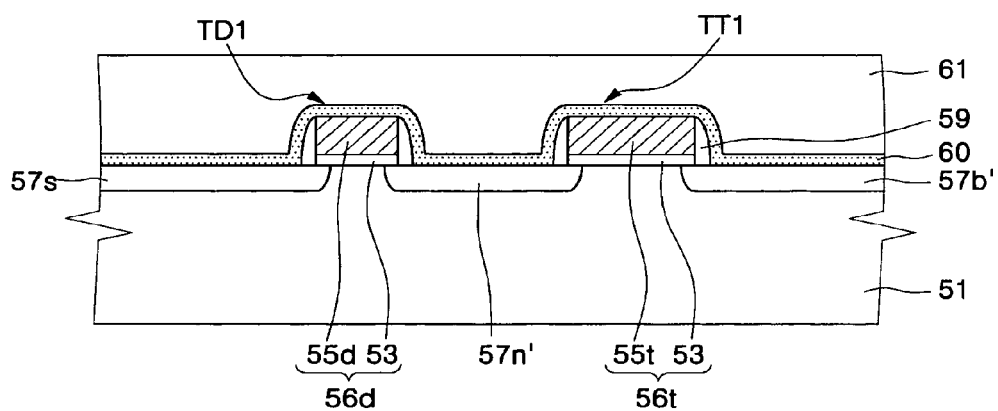
FIGS. 5 to 10 are cross-sectional views of fabrication products illustrating exemplary operations for fabricating SRAM cells in accordance with some embodiments of the present invention.

Referring to FIG. 5, an isolation layer (not shown) is formed at a predetermined region of a semiconductor substrate 51, for example, a single crystal silicon substrate, to define an active region. A first driver transistor TD1 and a first transfer transistor TT1, which are serially connected, are formed at the active region using, for example, conventional techniques. The first driver transistor TD1 includes a driver gate pattern 56d, a ground impurity region 57s and a node impurity region 57n', and the first transfer transistor TT1 includes a transfer gate pattern 56t and a bit line impurity region 57b', as well as the node impurity region 57n'. The first driver transistor TD1 and the first transfer transistor TT1 share the node impurity region 57n'. The driver gate pattern 56d includes a gate insulating layer 53 and a driver gate electrode 55d, and the transfer gate pattern 56t includes the gate insulating layer 53 and a transfer gate electrode 55t.

Spacers 59 may be formed on sidewalls of the gate patterns 56d and 56t. In such embodiments, the impurity regions 57s, 57n' and 57b' may include an LDD-type impurity region. An inorganic insulating layer 61 that is substantially free of carbon is formed on the semiconductor substrate having the first driver transistor TD1 and the first transfer transistor TT1. The inorganic insulating layer 61 may be an insulating layer that fills gap regions between the gate patterns 56d and 56t without significant voids. For example, the inorganic insulating layer 61 may be an HDP oxide layer. The inorganic insulating layer 61 may be planarized to form a substantially flat surface.

An etch stop layer 60 may be formed on the semiconductor substrate having the first driver transistor TD1 and the first transfer transistor TT1 prior to formation of the inorganic insulating layer 61. The etch stop layer 60 may be an insulating layer having an etch selectivity with respect to the inorganic insulating layer 61. For example, the etch stop layer 60 may be a silicon nitride layer.

Figure 6:
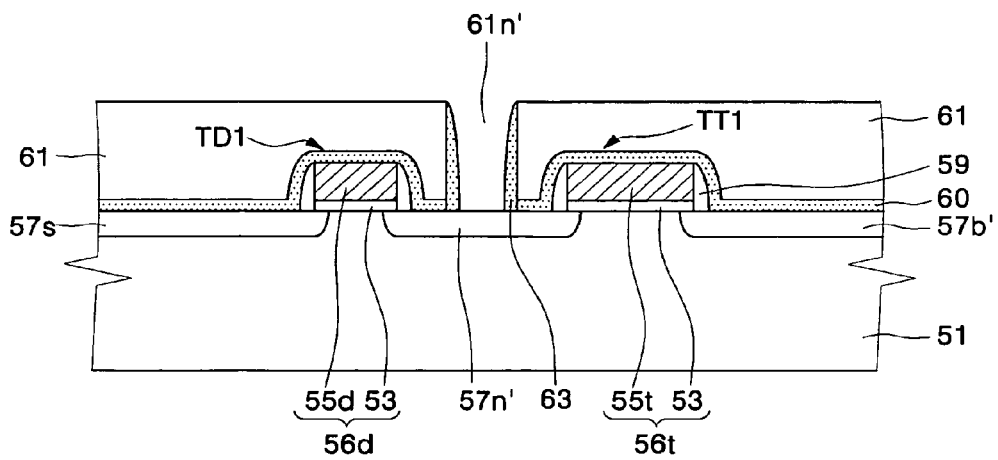

Referring to FIG. 6, the inorganic insulating layer 61 and the etch stop layer 60 are patterned to form a node contact hole 61n' exposing the node impurity region 57n'. A stress buffer layer is then formed on the semiconductor substrate having the node contact hole 61n'. The stress buffer layer may be a material layer less dense than the inorganic insulating layer 61. For example, the stress buffer layer may be a layer formed using a plasma CVD technique that employs tetra-ethyl-orthosilicate (TEOS) as a source material. The stress buffer layer is anisotropically etched to form a stress buffer spacer 63 on a sidewall of the node contact hole 61n'. The anisotropic etching process for forming the stress buffer spacer 63 may expose a top surface of the inorganic insulating layer 61 as well as a surface of the node impurity region 57n'.

Figure 7:
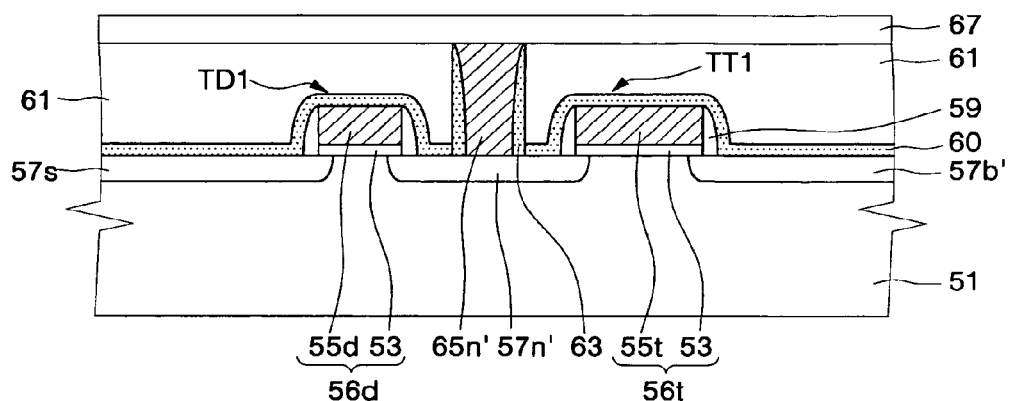

Referring to FIG. 7, a node contact plug 65n' that fills the node contact hole surrounded by the stress buffer spacer 63 is formed using an SEG process. The SEG process is performed using the exposed node impurity region 57n' as a seed layer. The node contact plug 65n' may be a semiconductor plug, for example, a silicon plug. Even though a stress may be generated by the inorganic insulating layer 61 during the SEG process, the stress buffer spacer 63 can significantly alleviate the stress applied to the node contact plug 65n'. As a result, the stress buffer spacer 63 may suppress generation of crystalline defects in the node contact plug 65n'.

When the node contact hole 61n' is formed by patterning at least two different material layers (i.e. the etch stop layer 60 and the inorganic insulating layer 61) and the node contact plug 65n' is formed without the stress buffer spacer 63, it may be difficult to enhance the selectivity of the SEG process for forming the node contact plug 65n'. For example, in the event that the etch stop layer 60 and the inorganic insulating layer 61 are a silicon nitride layer and a silicon oxide layer, respectively, a silicon seed generation rate on the silicon nitride layer exposed by the node contact hole 61n' may be higher than that on the silicon oxide layer exposed by the node contact hole 61n'. The difference of the silicon seed generation rates on the sidewall of the node contact hole 61n' may accelerate generation of crystalline defects in the node contact plug 65n'.

However, according to the illustrated embodiments of the present invention, the selectivity of the SEG process may be significantly enhanced because the sidewall of the node contact hole 61n' is covered with the stress buffer spacer 63. As a result, crystalline defects in the node contact plug 65n' can be reduced.

Subsequently, a semiconductor layer 67, such as an amorphous semiconductor layer or a polycrystalline semiconductor layer, is formed on the semiconductor substrate having the node contact plug 65n'. If the node contact plug 65n' is a single crystal silicon plug, the semiconductor layer 67 may be a silicon layer, such as an amorphous silicon layer or a polycrystalline silicon layer.

Figure 8:
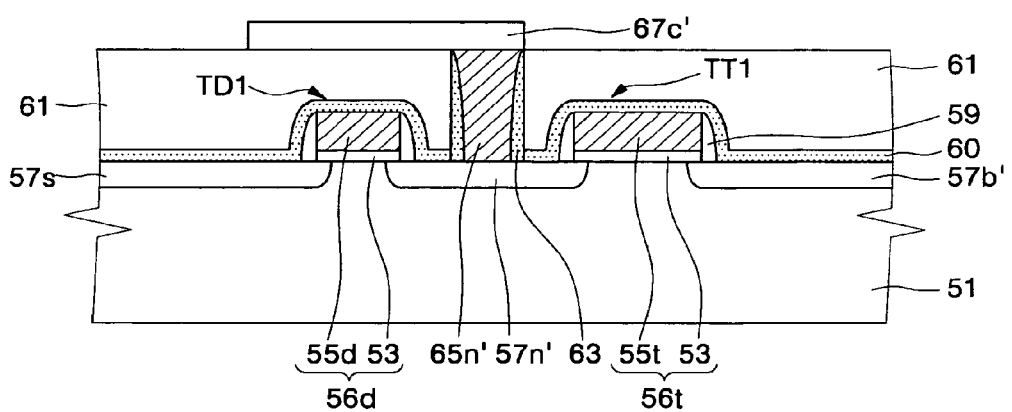

Referring to FIG. 8, the semiconductor layer 67 is patterned to form a semiconductor body pattern contacting the node contact plug 65n'. The semiconductor body pattern may be formed over the first driver transistor TD1. The semiconductor body pattern is converted to a crystallized semiconductor body pattern 67c' using a solid phase epitaxial (SPE) process. The SPE process may be carried out using the node contact plug 65n' as a seed layer. Accordingly, if the node contact plug 65n' has crystalline defects, crystalline defects may also be formed within the crystallized semiconductor body pattern 67c' due to the crystalline defects within the node contact plug 65n'. The crystalline defects within the crystallized semiconductor body pattern 67c' may degrade the electrical characteristics of the TFT to be formed at the crystallized semiconductor body pattern 67c' in a subsequent process. However, the node contact plug 65n' according to the illustrated embodiments of present invention may be formed to have a single crystal structure as described above. Thus, the semiconductor body pattern may be converted to have a single crystal structure during the SPE process. The SPE process may be carried out at a temperature in a range of about 500° C. to about 700° C. In addition, the SPE process may be carried out using a nitride gas as an ambient gas. Alternatively, the crystallized semiconductor body pattern 67c' may be formed by crystallizing the semiconductor layer 67 using the SPE process and then patterning the crystallized semiconductor layer.

Figure 9:
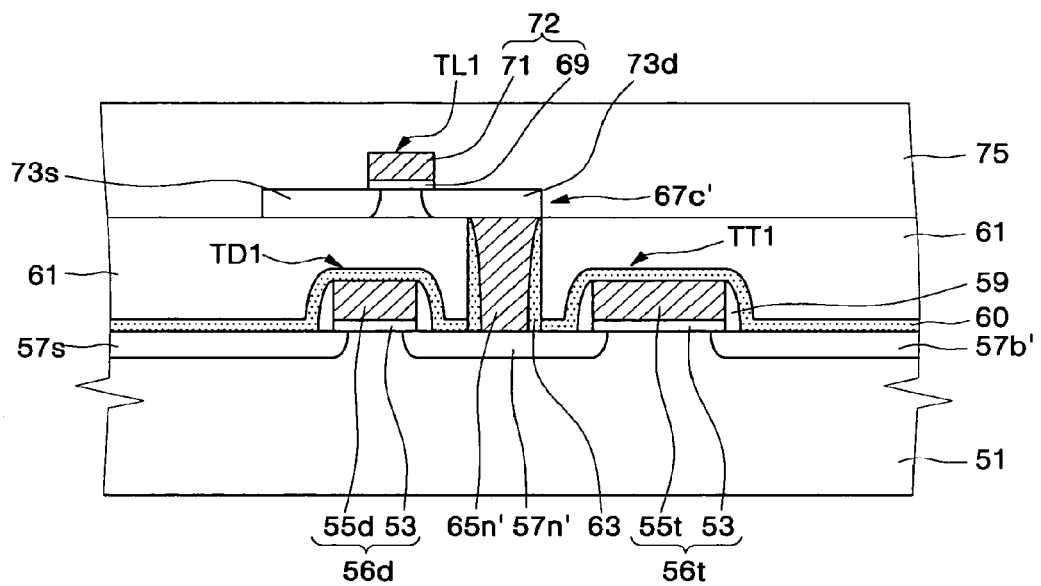

Referring to FIG. 9, a first load transistor (corresponding to TL1 of FIG. 3), i.e., a first load TFT, is formed at the crystallized semiconductor body pattern 67c' using, for example, conventional techniques. The first load TFT TL1 may include a source region 73s and a drain region 73d are respective ends of the crystallized semiconductor body pattern 67c' and a load gate pattern 72 positioned on a channel region between the source region 73s and the drain region 73d. The load gate pattern 72 includes a gate insulating layer 69 and a load gate electrode 71. The drain region 73d may be formed such that it contacts the node contact plug 65n'. A lower inter-layer insulating layer 75 is formed on the semiconductor substrate having the first load TFT TL1.

Figure 10:
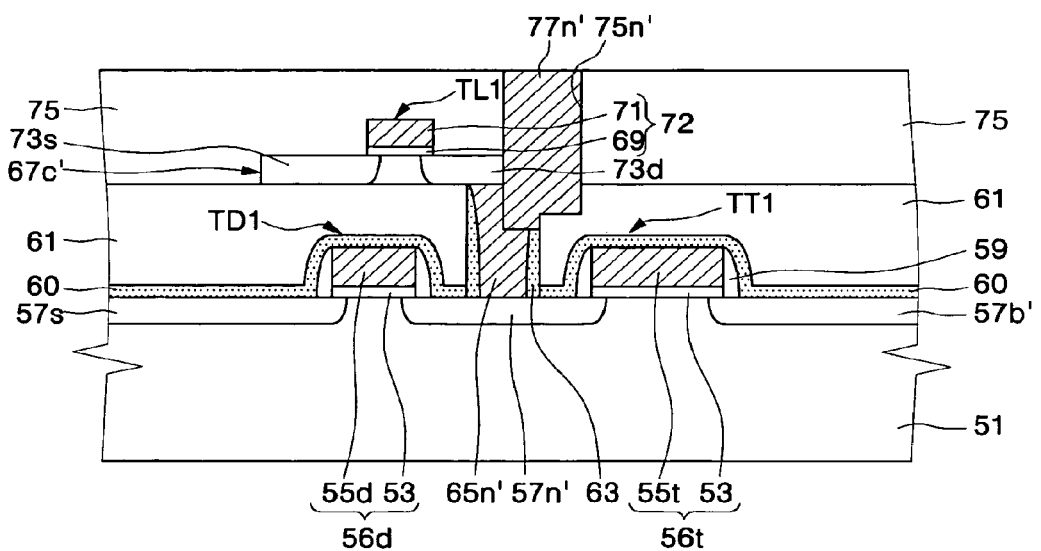

Referring to FIG. 10, the lower inter-layer insulating layer 75 is patterned to form a contact hole 75n' that exposes the drain region 73d and the inorganic insulating layer 61 adjacent the drain region 73d. The inorganic insulating layer 61 may also be etched to expose the node contact plug 65n' during formation of the contact hole 75n'. Alternatively, when the drain region 73d covers a top surface of the node contact plug 65n' as shown in FIG. 9, the lower inter-layer insulating layer 75 may be patterned to expose the drain region 73d, and the exposed drain region 73d may be further etched to expose the node contact plug 65n'.

Subsequently, a metal plug 77n' is formed in the contact hole 75n' using, for example, conventional techniques. The metal plug 77n' may be formed of a metal layer ohmically contacting both an N-type impurity region and a P-type impurity region. For example, when the drain region 73d and the node contact plug 65n are doped with P-type impurities and N-type impurities respectively, the metal plug 77n' may be formed of a metal, such as tungsten. Accordingly, when the first driver transistor TD1 and the first load TFT TL1 are an NMOS transistor and a PMOS transistor, respectively, and the node contact plug 65n' is an N-type single crystal semiconductor plug, the first driver transistor TD1 may be formed to have an ohmic contact with the first load TFT TL1 through the metal plug 77n'.

According to the embodiments of the present invention as described above, a TFT is formed on an inorganic insulating layer stacked on a semiconductor substrate, and a drain region of the TFT is electrically connected to the semiconductor substrate through a node contact plug that penetrates the inorganic insulating layer. A stress buffer spacer is interposed between the node contact plug and the inorganic insulating layer. The stress buffer spacer may alleviate the stress applied to the node contact plug while the node contact plug is formed using an SEG process. Accordingly, the stress buffer spacer may reduce or prevent formation of crystalline defects in the node contact plug. In addition, if the inorganic insulating layer does not contain carbon, carbon contamination of a body pattern of the TFT can be reduced. As a result, a high performance TFT having high reliability may be formed.

Many alterations and modifications may be made by those having ordinary skill in the art, given the benefit of the present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above and what is conceptually equivalent.

What is claimed is:

1. A method of manufacturing a semiconductor device comprising:
   providing a semiconductor substrate including at least one diffusion region;
   forming an electrode on the semiconductor substrate;
   forming a first insulator on the substrate and the electrode;
   forming a contact hole penetrating the first insulator to expose the diffusion region, the contact hole being confined to an area directly above the diffusion region;
   covering a sidewall of the contact hole with a second insulator, wherein the second insulator has a density lower than a density of the first insulator;
   epitaxially growing a semiconductor material within the contact hole; and
   forming a metal plug in the contact hole, wherein the metal plug is electrically connected to the epitaxially grown semiconductor material.

2. The method of claim 1, wherein opposing sidewalls of the contact hole are substantially vertical.

3. The method of claim 1, further comprising forming an etch stop layer on the semiconductor substrate, wherein the contact hole is formed by patterning the first insulator and the etch stop layer.

4. The method of claim 3, wherein the etch stop layer comprises a silicon nitride layer.

5. The method of claim 1, wherein the metal plug contacts the epitaxially grown semiconductor material.

6. The method of claim 1, wherein forming the first insulator comprises forming a high density plasma (HDP) oxide layer.

7. A method of manufacturing a semiconductor device comprising:
   providing a semiconductor substrate including at least one diffusion region;
   forming an electrode on the semiconductor substrate;
   forming a first insulator on the substrate and the electrode;
   forming a contact hole penetrating the first insulator to expose the diffusion region, the contact hole being confined to an area directly above the diffusion region;
   covering a sidewall of the contact hole with a second insulator, comprising forming the second insulator using a plasma CVD technique that employs tetra-ethyl-orthosilicate (TEOS) as a source material, wherein the second insulator has a density lower than a density of the first insulator; and
   epitaxially growing a semiconductor material within the contact hole.

8. A method of manufacturing a semiconductor device comprising:
   providing a semiconductor substrate with an impurity region;
   forming a silicon nitride layer on the semiconductor substrate;
   forming an inorganic insulating layer on the silicon nitride layer;
   patterning the inorganic insulating layer and the silicon nitride layer to form a contact hole exposing a portion of the impurity region;

forming a stress relieving insulating spacer on a sidewall of the contact hole, wherein the stress relieving insulating spacer has a lower density than the inorganic insulating layer;

forming a plug in the contact hole comprising epitaxially growing a semiconductor using the impurity region as a seed layer; and forming a metal plug in the contact hole, wherein the metal plug is electrically connected to the epitaxially grown semiconductor.

9. The method of claim 8, wherein the metal plug contacts the epitaxially grown semiconductor.

10. The method of claim 8, wherein the epitaxially grown semiconductor is formed so that a top surface of the semiconductor is at a same level as a top of the contact hole.

11. The method of claim 8, wherein opposing sidewalls of the contact hole are substantially vertical.

12. The method of claim 8, wherein the stress relieving insulating spacer has a density lower than a density of the inorganic insulating layer.

13. The method of claim 8, wherein forming the inorganic insulating layer comprises forming a high density plasma (HDP) oxide layer.

14. The method of claim 8, further comprising forming the stress relieving insulating spacer using a plasma CVD technique that employs plasma tetra-ethyl-orthosilicate (TEOS) as a source material.

15. A method of manufacturing a semiconductor device comprising:

providing a semiconductor substrate with an impurity region;

forming a silicon nitride layer on the semiconductor substrate;

forming an inorganic insulating layer on the silicon nitride layer;

patterning the inorganic insulating layer and the silicon nitride layer to form a contact hole exposing a portion of the impurity region;

forming a stress buffer spacer on a sidewall of the contact hole, wherein the stress buffer spacer has a lower density than the inorganic insulating layer;

forming a plug in the contact hole comprising epitaxially growing a semiconductor using the impurity region as a seed layer;

forming an interlayer insulating layer on the inorganic insulating layer;

patterning the interlayer insulating layer to form a hole exposing a portion of the contact hole; and forming a metal plug in the inorganic insulating layer and the interlayer insulating layer, wherein the metal plug is electrically connected to the epitaxially grown semiconductor.

16. The method of claim 15, wherein the metal plug contacts the epitaxially grown semiconductor.

17. The method of claim 15, wherein the plug in the contact hole is substantially formed of the epitaxially grown semiconductor.

18. The method of claim 15, wherein opposing sidewalls of the contact hole are substantially vertical.

19. The method of claim 15, wherein forming the inorganic insulating layer comprises forming a high density plasma (HDP) oxide layer.

20. The method of claim 15, further comprising forming the stress buffer spacer using a plasma CVD technique that employs plasma tetra-ethyl-orthosilicate (TEOS) as a source material.

* * * * *

UNITED STATES PATENT AND TRADEMARK OFFICE
CERTIFICATE OF CORRECTION

| | | |
|---|---|---|
| PATENT NO. | : 7,998,851 B2 | Page 1 of 1 |
| APPLICATION NO. | : 12/715599 | |
| DATED | : August 16, 2011 | |
| INVENTOR(S) | : Yong-Hoon Son et al. | |

It is certified that error appears in the above-identified patent and that said Letters Patent is hereby corrected as shown below:

At column 1, lines 9-15, the paragraph:

"This application claims the benefit of Korean Patent Application No. 2004-0028804, filed Apr. 26, 2004, the contents of which are hereby incorporated by reference in their entirety. This application is a continuation of and claims priority to U.S. application Ser. No. 11/092,524, filed Mar. 29, 2005, now abandoned, the contents of which are hereby incorporated by reference in their entirety."

should be changed to the following paragraph:

--This application is a Continuation of and claims priority to U.S. application Ser. No. 11/092,524, filed Mar. 29, 2005, now abandoned, which claims the benefit of Korean Patent Application No. 2004-0028804, filed Apr. 26, 2004, the contents of each of which are hereby incorporated by reference in their entirety.--

Signed and Sealed this
Seventeenth Day of July, 2012

David J. Kappos
*Director of the United States Patent and Trademark Office*